(12) United States Patent
Coolbaugh et al.

(10) Patent No.: US 7,829,452 B2
(45) Date of Patent: Nov. 9, 2010

(54) TERMINAL PAD STRUCTURES AND METHODS OF FABRICATING SAME

(75) Inventors: Douglas D. Coolbaugh, Highland, NY (US); Daniel C. Edelstein, White Plains, NY (US); Ebenezer E. Eshun, Highland, NY (US); Zhong-Xiang He, Essex Junction, VT (US); Robert M. Rassel, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/348,934

(22) Filed: Jan. 6, 2009

(65) Prior Publication Data

US 2009/0155993 A1 Jun. 18, 2009

Related U.S. Application Data

(62) Division of application No. 11/953,927, filed on Dec. 11, 2007, now Pat. No. 7,494,912, which is a division of application No. 10/908,346, filed on May 9, 2005, now Pat. No. 7,361,993.

(51) Int. Cl.
*H01L 21/44* (2006.01)

(52) U.S. Cl. .................. 438/612; 438/613; 438/618; 257/E21.508

(58) Field of Classification Search .......... 438/612, 438/613, 614, 627, 634, 638–640, 687, 688; 257/E21.508

See application file for complete search history.

(56) References Cited

U.S. PATENT DOCUMENTS

| | | | |
|---|---|---|---|
| 6,033,939 | A | 3/2000 | Agarwala et al. |
| 6,376,353 | B1 | 4/2002 | Zhou et al. |
| 6,451,681 | B1 | 9/2002 | Greer |
| 6,768,199 | B2 | 7/2004 | Yoon et al. |
| 6,828,677 | B2 | 12/2004 | Yap et al. |
| 7,122,458 | B2 | 10/2006 | Cheng et al. |
| 7,122,902 | B2 | 10/2006 | Hatano et al. |
| 7,397,125 | B2 * | 7/2008 | Oda .................. 257/758 |

OTHER PUBLICATIONS

Notice of Allowance (Mail Date Oct. 17, 2008) for U.S. Appl. No. 11/953,927, filed Dec. 11, 2007; Confirmation No. 3059.
Notice of Allowance (Mail Date Nov. 29, 2007) for U.S. Appl. No. 10/908,346, filed May 9, 2005; Confirmation No. 5446; Patent No. 7,361,993 issued Apr. 22, 2008.

* cited by examiner

*Primary Examiner*—Hoai v Pham
(74) *Attorney, Agent, or Firm*—Schmeiser, Olsen & Watts; Joseph Petrokaitis

(57) ABSTRACT

Terminal pads and methods of fabricating terminal pads. The methods including forming a conductive diffusion barrier under a conductive pad in or overlapped by a passivation layer comprised of multiple dielectric layers including diffusion barrier layers. The methods including forming the terminal pads subtractively or by a damascene process.

17 Claims, 8 Drawing Sheets

TERMINAL PAD STRUCTURES AND METHODS OF FABRICATING SAME

RELATED APPLICATIONS

This application is a division of U.S. patent application Ser. No. 11/953,927 filed on Dec. 11, 2007 which is a division of U.S. Pat. No. 7,361,993 Ser. No. 10/908,346 filed on May 9, 2005 and issued Apr. 22, 2008.

FIELD OF THE INVENTION

The present invention relates to the field of integrated circuits; more specifically, it relates to terminal pads for an integrated circuit and methods for fabricating the terminal pads.

BACKGROUND OF THE INVENTION

Integrated circuits include devices such as metal-oxide-silicon field effect transistors (MOSFETs) formed in a semiconductor substrate, interconnected into circuits by wires in interconnect layers formed on top of the substrate. At the highest or uppermost level of an integrated circuit chips, these wires must be connected to terminal pads which allow wire-bond or solder bump connections to a next level of packaging, such as to a module or circuit board. Conventional terminal pads are complex structures because of the structural strength and contamination seal the terminal pad must provide. For integrated circuit chips for low cost or commodity products and such as used in wireless technology, conventional terminal pad structures and fabrication processes add significant costs to the fabrication process. Therefore, there is a need for cost performance terminal pad structures and fabrication processes having structural strength and contamination seal abilities.

SUMMARY OF THE INVENTION

A first aspect of the present invention is a method of forming a terminal pad, comprising: providing an electrically conductive wire formed in a dielectric layer on a substrate, a top surface of the wire coplanar with a top surface of the dielectric layer; forming a passivation layer on the top surface of the dielectric layer and the top surface of the wire, the passivation layer comprising a lower dielectric layer on the top surfaces of the dielectric layer and the wire, an intermediate dielectric layer on a top surface of the lower dielectric layer and an upper dielectric layer on a top surface of the intermediate dielectric layer; forming a trench in the passivation layer, the trench extending from a top surface of the passivation layer to a bottom surface of the passivation layer, the top surface of the wire exposed in the bottom of the trench; forming a conformal and electrically conductive liner directly on sidewalls of the trench and in direct physical and electrical contact with the top surface of the wire exposed in the bottom of the trench; and filling the trench with an electrical core conductor, a top surface of the core conductor, a top surface of the liner and a top surface of the passivation layer coplanar, the core conductor and the liner comprising the terminal pad.

A second aspect of the present invention is a structure, comprising: an electrically conductive wire formed in a dielectric layer on a substrate, a top surface of the wire coplanar with a top surface of the dielectric layer; a passivation layer on the top surface of the dielectric layer and the top surface of the wire, the passivation layer comprising a lower dielectric layer on the top surfaces of the dielectric layer and the wire, an intermediate dielectric layer on a top surface of the lower dielectric layer and an upper dielectric layer on a top surface of the intermediate dielectric layer; a conformal and electrically conductive liner on sidewalls of the trench and in direct physical and electrical contact with the top surface of the wire contained within the trench; and an electrical core conductor, a top surface of the core conductor, a top surface of the liner and a top surface of the passivation layer coplanar, the core conductor and the liner comprising a terminal pad.

A third aspect of the present invention is a method of forming a terminal pad, comprising: providing an electrically conductive wire formed in a dielectric layer on a substrate, a top surface of the wire coplanar with a top surface of the dielectric layer; forming an electrically conductive barrier layer on the top surface of the dielectric layer and the top surface of the wire; forming an electrically conductive layer on a top surface of the conductive barrier layer; subtractively removing regions of the conductive barrier layer and regions of the conductive layer to form the terminal pad; forming an electrically non-conductive passivation layer on the top surface of the dielectric layer and all exposed surfaces of the terminal pad, the passivation layer comprising a lower dielectric layer on the top surface of the dielectric layer and on the all exposed surfaces of the terminal pad and an intermediate dielectric layer on a top surface of the lower dielectric layer; and forming a via in the passivation layer, the via extending from a top surface of the passivation layer to a top surface of the terminal pad.

A fourth aspect of the present invention is a structure, comprising: an electrically conductive wire formed in a dielectric layer on a substrate, a top surface of the wire coplanar with a top surface of the dielectric layer; an electrically conductive barrier layer on the top surface of the dielectric layer and the top surface of the wire; a terminal pad comprising an electrically conductive layer on a top surface of an electrically conductive barrier layer, the terminal pad in physical and electrical contact with the wire; an electrically non-conductive passivation layer on the top surface of the dielectric layer and all exposed surfaces of the terminal pad, the passivation layer comprising a lower dielectric layer on the top surface of the dielectric layer and the all exposed surfaces of the terminal pad and an intermediate dielectric layer on a top surface of the lower dielectric layer; and a via in the passivation layer, the via extending from a top surface of the passivation layer to a top surface of the terminal pad.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
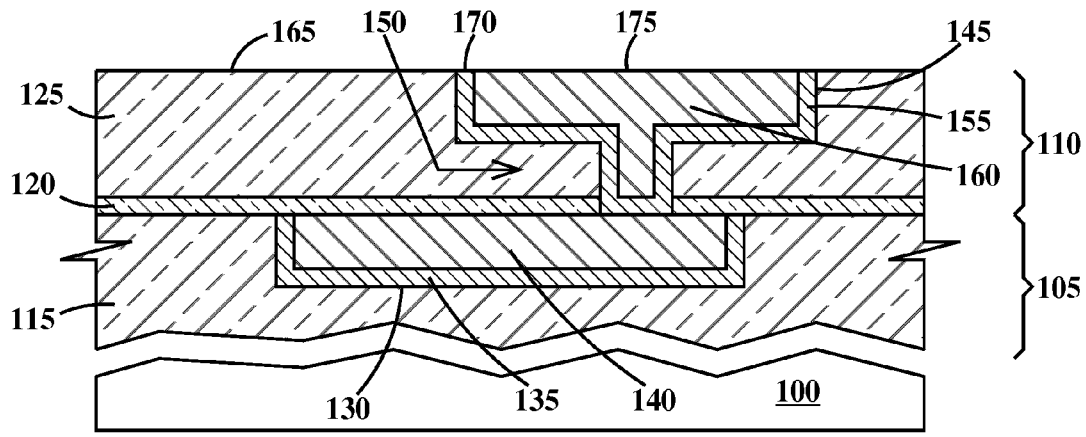
FIGS. 1A through 1F are cross-sectional views illustrating fabrication of a terminal pad structure according to a first embodiment of the present invention.

FIGS. 1A through 1F are cross-sectional views illustrating fabrication of a terminal pad structure according to a first embodiment of the present invention. FIG. 1A illustrates an exemplary integrated circuit chip prior to formation of a terminal pad according to the first embodiment of the present invention. In FIG. 1A formed on a substrate 100, are wiring levels 105 and 110. Wiring level 105 includes a dielectric layer 115. Wiring level 110 includes a dielectric layer 120 and a dielectric layer 125. Formed in dielectric layer 105 is a damascene wire 130 comprising an electrically conductive liner 135 and an electrically conductive core conductor 140. Formed in interlevel dielectric layer 110 is a damascene wire 145 and integral via 150 comprising an electrically conductive liner 155 and an electrically conductive core conductor 160. Top surface 165 of dielectric layer 125, top surface 170 of conductive liner 155 and top surface 175 of core conductor 160 are coplanar.

In one example dielectric layers 115 and 125 independently comprise silicon dioxide ($SiO_2$), or a low K (dielectric constant) material, examples of which include but are not limited to hydrogen silsesquioxane polymer (HSQ), methyl silsesquioxane polymer (MSQ), polyphenylene oligomer, and $SiO_x(CH3)_y$. A low K dielectric material has a relative permittivity of 4 or less.

In one example, conductive liners 135 and 155 independently comprise Ti, TiN, Ta, TaN, W or combinations thereof. In one example, core conductors 140 and 160 comprise copper or copper alloys. Dielectric layer 120 may act as a diffusion barrier for materials of core conductors 140 and 160. In the example of core conductor 160 being copper, dielectric layer 120 may be a diffusion barrier for copper and may comprise, for example, silicon nitride. Conductive liners 135 and 155 may act as a diffusion barriers for materials of core conductors 140 and 160 respectively. In the example of core conductor 160 being copper, conductive liners 135 and 155 may be diffusion barriers for copper.

While two levels of wiring are illustrated in FIG. 1A, any number of wiring levels similar to wiring levels 105 and 100 may be employed. Wiring level 110, should be considered the last wiring level before terminal pads are formed. The distinction between a wiring level and the terminal pad level of an integrated circuit is a wiring level interconnects an upper wiring level to a lower wiring level or to contacts to devices such as metal-oxide-silicon field effect transistors (MOSFETs) while terminal pads are connected to a lower wiring level only (there may be terminal pad to terminal pad connections) and there are no wiring levels above the terminal pad level.

Figure 1B:
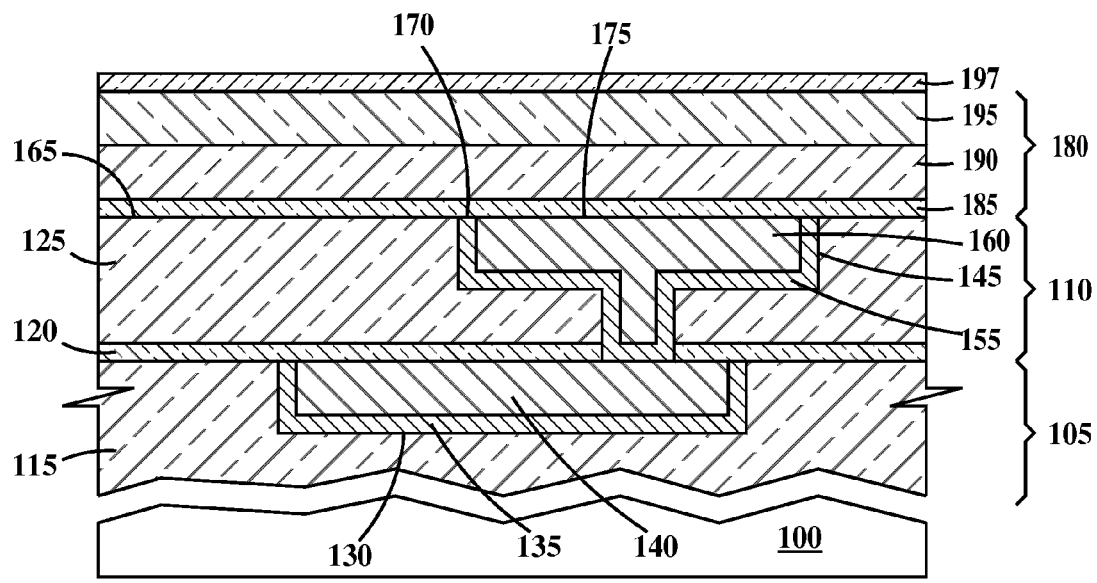

In FIG. 1B, a dielectric passivation layer 180 is formed in direct contact with top surface 165 of dielectric layer 125, top surface 170 of conductive liner 155 and top surface 175 of core conductor 160. Passivation layer 180 includes a lower dielectric layer 185 formed on top surface 165 of dielectric layer 125, top surface 170 of conductive liner 155 and top surface 175 of core conductor 160, an intermediate dielectric layer 190 formed on lower dielectric layer 185 and an upper dielectric layer 195 formed on intermediate dielectric layer 190. In one example, lower dielectric layer 185 comprises silicon nitride (SiN) or silicon carbide nitride (SiCN) and is between about 0.05 micron to about 0.1 micron thick. In one example, intermediate dielectric layer 190 comprises silicon dioxide and is between about 0.5 micron to about 2 microns thick. In one example, upper dielectric layer 195 comprises silicon nitride and is between about 0.5 micron to about 2.0 microns thick. Passivation layer prevents contamination such as ionic contamination (e.g. chlorine, water vapor) from reaching core conductor 160, which is particularly important when core conductor 160 comprises copper or aluminum.

Formed on top of upper dielectric layer 195 is an optional chemical-mechanical-polish (CMP) polish stop layer 197.

Figure 1C:
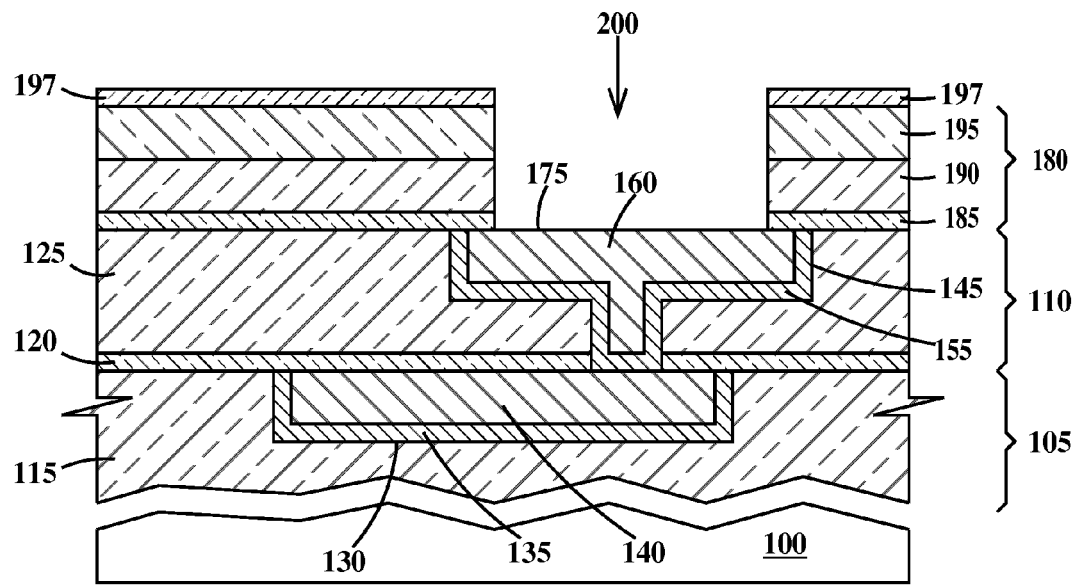

In FIG. 1C, a trench 200 is etched through optional polish stop layer 197 (if present), upper dielectric layer 195, intermediate dielectric layer 190 and lower dielectric lower dielectric layer 185 to expose top surface 175 of core conductor 160 but not expose any portion of liner 155 or any portion of dielectric layer 125. Trench 200 is thus "fully landed" (see FIGS. 2A and 2B) on wire 145. Trench 200 may be formed by any number of well-known photolithographic processes followed by any number of well-known directional etch processes such as reactive ion etch (RIE).

Figure 1D:
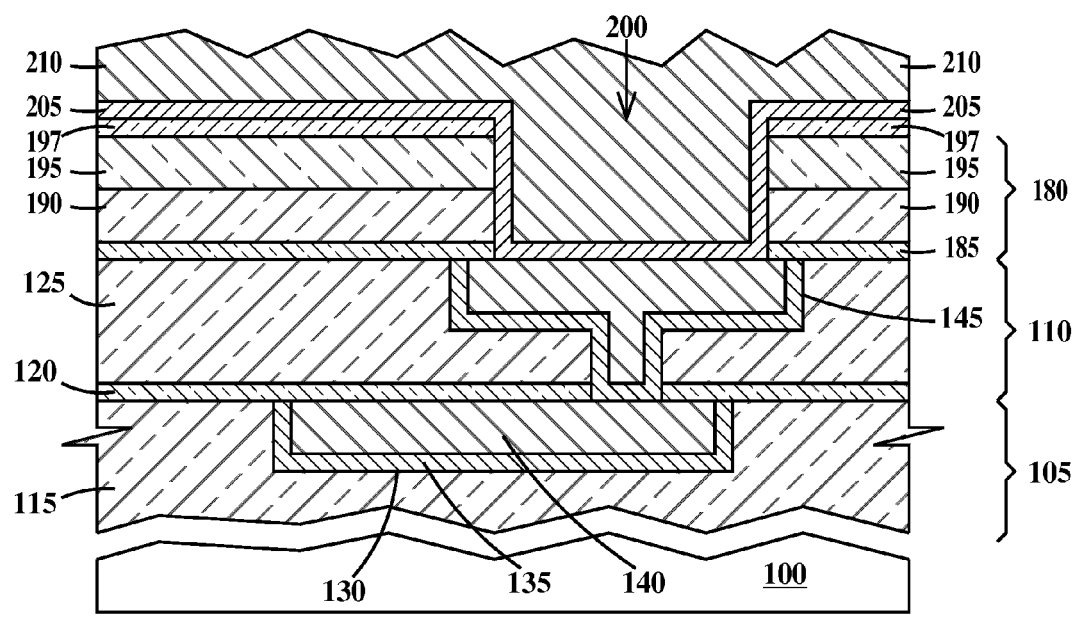

In FIG. 1D, a conformal conductive liner 205 is formed on all exposed surfaces of core conductor 160, lower dielectric layer 185, intermediate dielectric layer 190, upper dielectric layer 195 and optional polish stop layer 197 (if present). An electrically conductive fill 210 is formed on conductive liner completely filling trench 200.

Figure 1E:
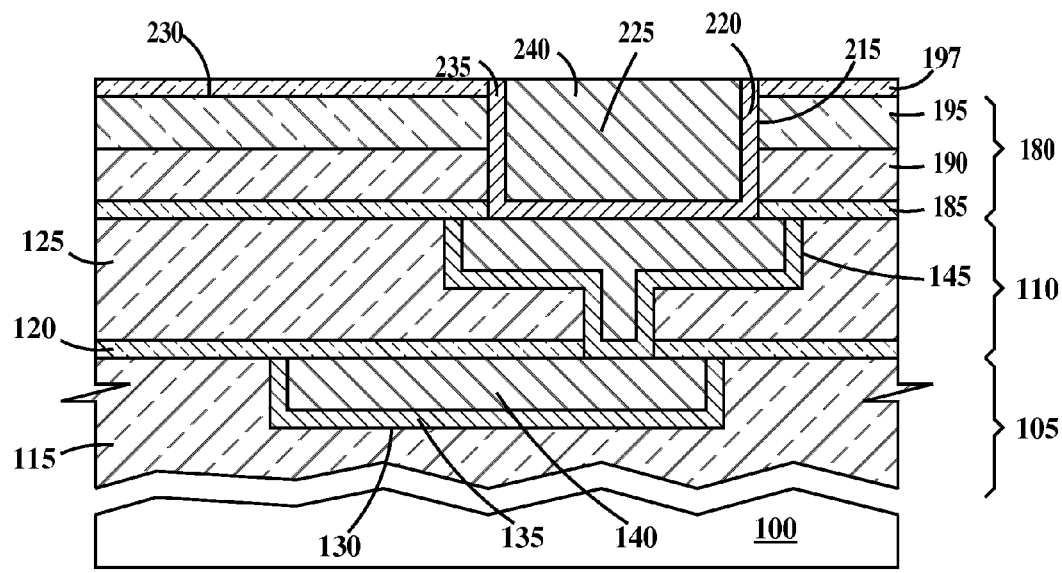

In FIG. 1E, a CMP process is performed, to create a terminal pad 215 comprising an electrically conductive liner 220 and an electrically conductive core conductor 225, a top surface 230 of upper dielectric layer 195, a top surface 235 of conductive liner 220 and a top surface 240 of core conductor 225 being coplanar. In one example, conductive liner 220 comprises comprise Ti, TiN, Ta, TaN, W or combinations thereof. In one example, conductive core 225 comprises Al or AlCu (not more than about 1% Cu). The fact that terminal pad 215 is a damascene structure (recessed or inlayed into a supporting layer) adds strength to the overall terminal pad structure. The fact that pad 215 is "fully landed" on wire 145 and damascened into passivation layer 180 seals wiring level 110 and all lower wiring levels from contamination.

If optional polish stop layer 197 (see FIG. 1B) was formed in FIG. 1A, it may be thinned by the CMP process as illustrated in FIG. 1E. Alternatively, optional polish stop layer 197 may not be present in FIG. 1E (and subsequently in FIG. 1F) because of the possibility of the polish stop layer being entirely consumed by the CMP process.

At this point wirebond connections may be made to terminal pad 215. Wirebonding is a process whereby, thin gold or aluminum wires are attached to the pads using pressure and heat energy or ultrasonic energy. Generally, an interfacial alloy is formed between the wirebond wire and terminal pad.

Figure 1F:
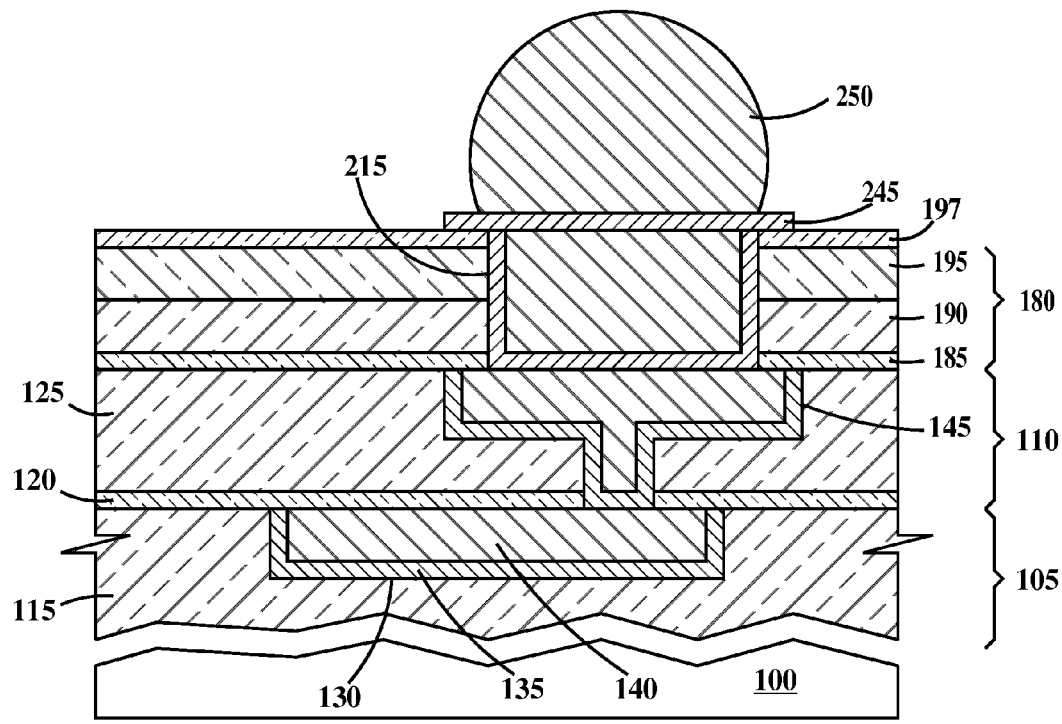

In FIG. 1F, further processing is performed in order to make a solder bump connection to terminal pad 215. Solder bump connections are also known controlled collapse chip connections (C4). In FIG. 1F a ball limiting metal (BLM) pad 245 is formed on terminal pad 215. BLM pad 245 completely overlaps terminal pad 215 (See FIGS. 2A and 2B). A solder bump 250 is then formed on BLM pad 245. Solder bump 250 is illustrated after a thermal reflow process has been performed. In one example, BLM pad 245 and solder bump 250 are formed by evaporation through a metal mask. In a second example, BLM pad 245 is formed by evaporation through a metal mask and solder bump 250 is formed by electroplating through an organic mask after the BLM is formed. In one example BLM pad 245 is formed from multiple layers of metals, each layer selected from the group consisting of Cr, Cu, Au, Ni, Ti, TiN, Ta and TaN. In one example, BLM pad 245 comprises a layer of Cu over a layer of Cr in contact with terminal pad 215 and a layer of Au over the layer of Cu. In one example, BLM pad 245 comprises a layer of Ni over a layer of Cr in contact with terminal pad 215 and a layer of Au over the layer of Ni. In one example, solder bump 250 comprises a Pb/Sn alloy.

Figure 2A:
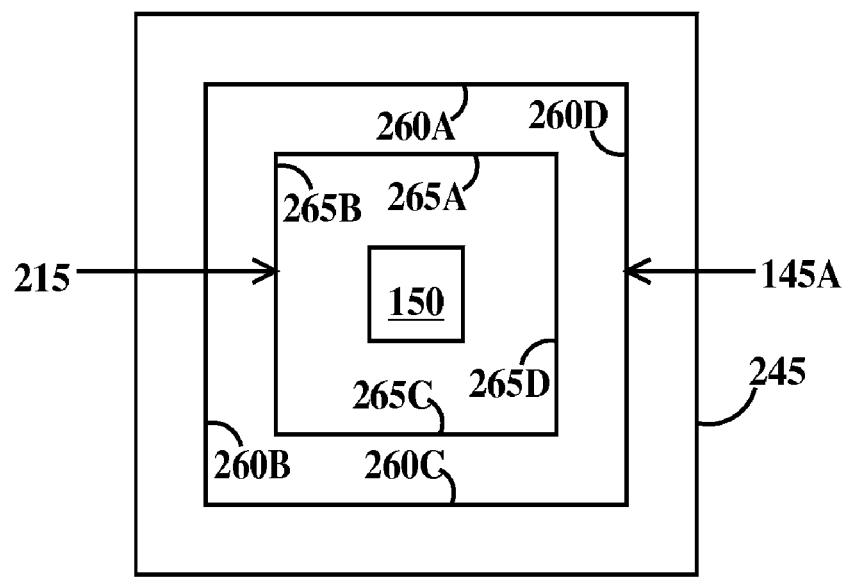
FIGS. 2A and 2B are top views of terminal pads according the first embodiment of the present invention.
Figure 2B:
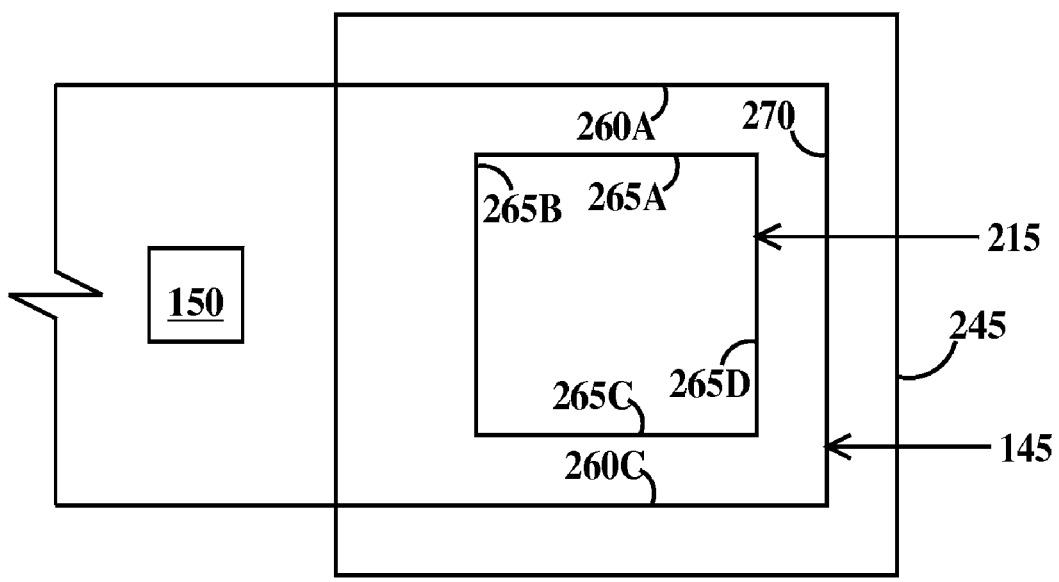

FIGS. 2A and 2B are top views of terminal pads according to the first embodiment of the present invention. In FIG. 2A, wire 145 (see FIG. 1E or 1F) is in itself a wiring pad 145A having sides 260A, 260B, 260C and 260D. Terminal pad 215 has sides 265A, 265B, 265C and 265D. Sides 265A, 265B, 265C and 265D of terminal pad 215 are aligned within the perimeter formed by sides 260A, 260B, 260C and 260D of wiring pad 145A. In FIG. 2A, BLM pad 245 overlaps sides 260A, 260B, 260C and 260D of wire pad 145A as well as sides 265A, 265B, 265C and 265D of terminal pad 215. Alternatively, BLM pad 245 may overlap sides 265A, 265B, 265C and 265D of terminal pad 245 but not overlap sides 260A, 260B, 260C and 260D of wire pad 145A.

In FIG. 2B, wire 145 has sides 260A, 260C and an end 270. Terminal pad 215 has sides 265A, 265B, 265C and 265D. Sides 265A, 265B, 265C and 265D of terminal pad 215 are aligned within respective sides 260A, 260C and end 270 of wire 145. In FIG. 2B, BLM pad 245 overlaps sides 260A, 260C and end 270 of wire 145 as well as sides 265A, 265B, 265C and 265D of terminal pad 245. However, side 265B of terminal pad 215 does not extend across any side of wire 145. Alternatively, BLM pad 245 may overlap sides 265A, 265B, 265C and 265D of terminal pad 215 but not overlap sides 260A, 260C and end 270 of wire 145. Again, side 265B of terminal pad 215 would not extend across any side of wire 145A.

Figure 3A:
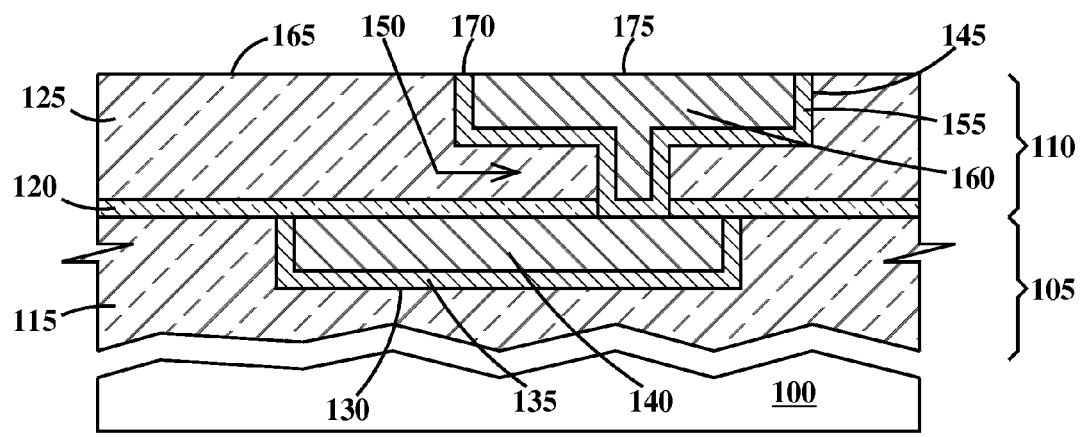
FIGS. 3A through 3F are cross-sectional views illustrating fabrication of a terminal pad structure according to a second embodiment of the present invention.
Figure 3B:
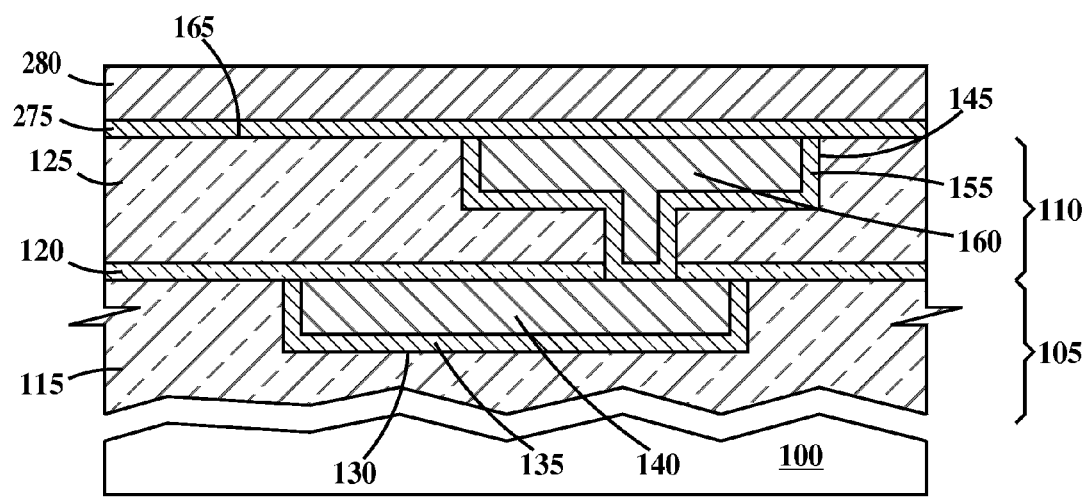

FIGS. 3A through 3F are cross-sectional views illustrating fabrication of a terminal pad structure according to a second embodiment of the present invention. FIG. 3A illustrates an exemplary integrated circuit chip prior to formation of a terminal pad according to the second embodiment of the present invention. FIG. 3A is identical to FIG. 1A. In FIG. 3B, an electrically conductive barrier layer 275 is formed on top surface 165 of dielectric layer 125. An electrically conductive layer 280 is then formed on conductive barrier layer 275.

Figure 3C:
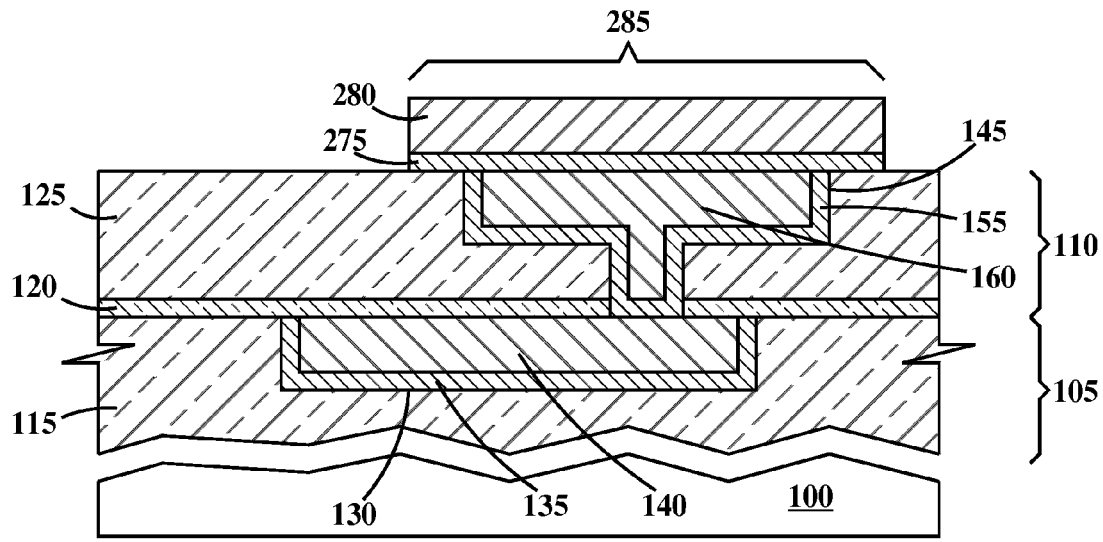

In FIG. 3C, a terminal pad 285 is formed from conductive barrier layer 275 and conductive layer 280 subtractively. Terminal pad 285 may be formed by any number of well known photolithographic processes followed by any number of etch processes such as RIE or wet etching. In one example, conductive barrier layer 275 is a diffusion barrier to a material contained within wire 145. In one example, conductive barrier layer 275 comprises Ti, TiN, Ta, TaN, W or combinations thereof. In one example, conductive layer 280 comprises Al or AlCu (not more than about 1% Cu). In the example, of conductive layer 280 containing aluminum and a chlorine based RIE etch is used, a passivation step using chromic-phosphoric acid may be performed in order to passivation exposed aluminum.

Figure 3D:
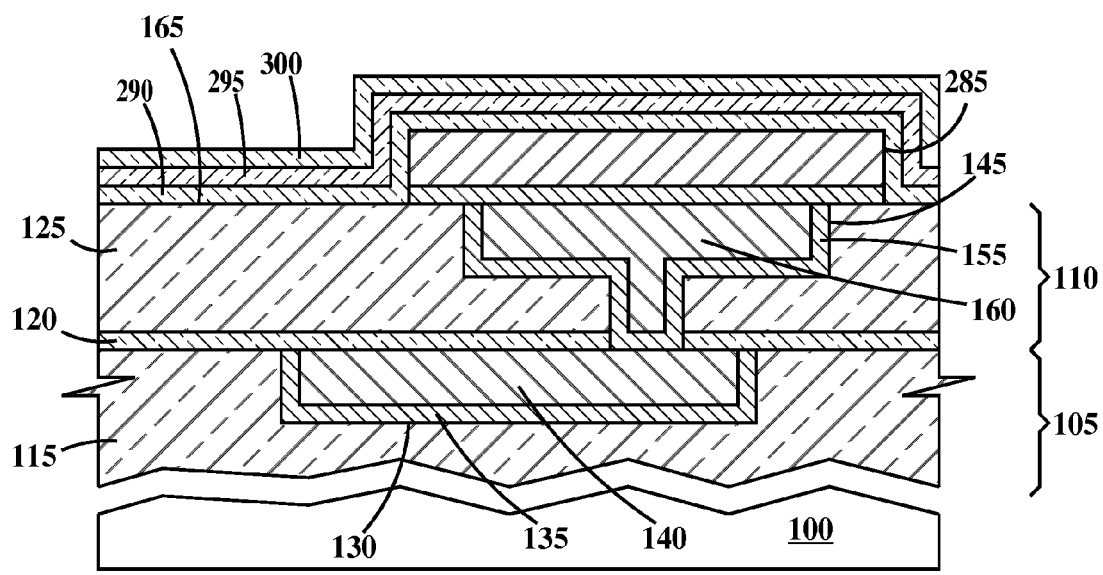

In FIG. 3D, a conformal lower dielectric layer 290 is formed in direct contact with top surface 165 of dielectric layer 125 and all exposed surfaces of terminal pad 285. An intermediate dielectric layer 295 is formed on lower dielectric layer 290 and an optional electrically non-conductive upper layer 300 is formed on intermediate dielectric layer 295. In one example, lower dielectric layer 290 comprises silicon dioxide and is between about 0.5 micron to about 2.0 microns thick. In one example, intermediate dielectric layer 295 comprises silicon nitride and is between about 0.5 micron to about 2.0 microns thick. In one example, optional upper layer 300 (if present) comprises polyimide or photosensitive polyimide and is between about 2 microns to about 10 microns thick.

Figure 3E:
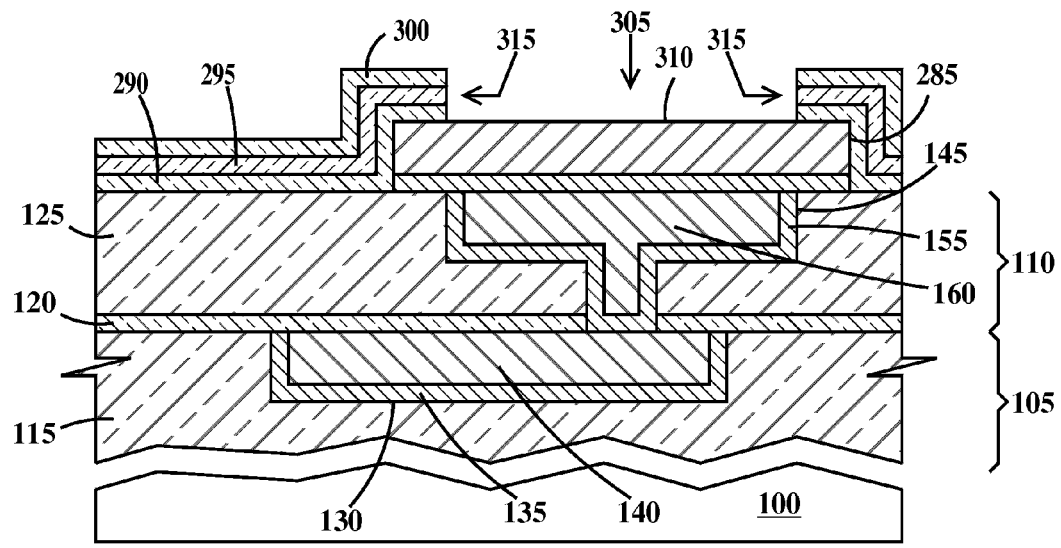

In FIG. 3E, a via 305 is etched through lower dielectric layer 290, intermediate dielectric layer 295 and upper layer 300 to a expose top surface 310 of terminal pad 285. Via 305 may be formed by any number of well-known photolithographic processes followed by any number of well-known etch processes such as RIE. Terminal pad 285 extends under all edges 315 of via 305. Via 305 is "fully landed" on terminal pad 305. The fact that terminal pad 285 is overlapped by lower dielectric layer 290, intermediate dielectric layer 295 and upper layer 300 adds strength to the overall terminal pad structure. The fact that via 305 is "fully landed" on terminal pad 285 seals wiring level 110 and all lower wiring levels from contamination and adds strength to the overall terminal pad structure. At this point wirebond connections may be made to terminal pad 285 as described supra in reference to FIG. 1E.

Figure 3F:
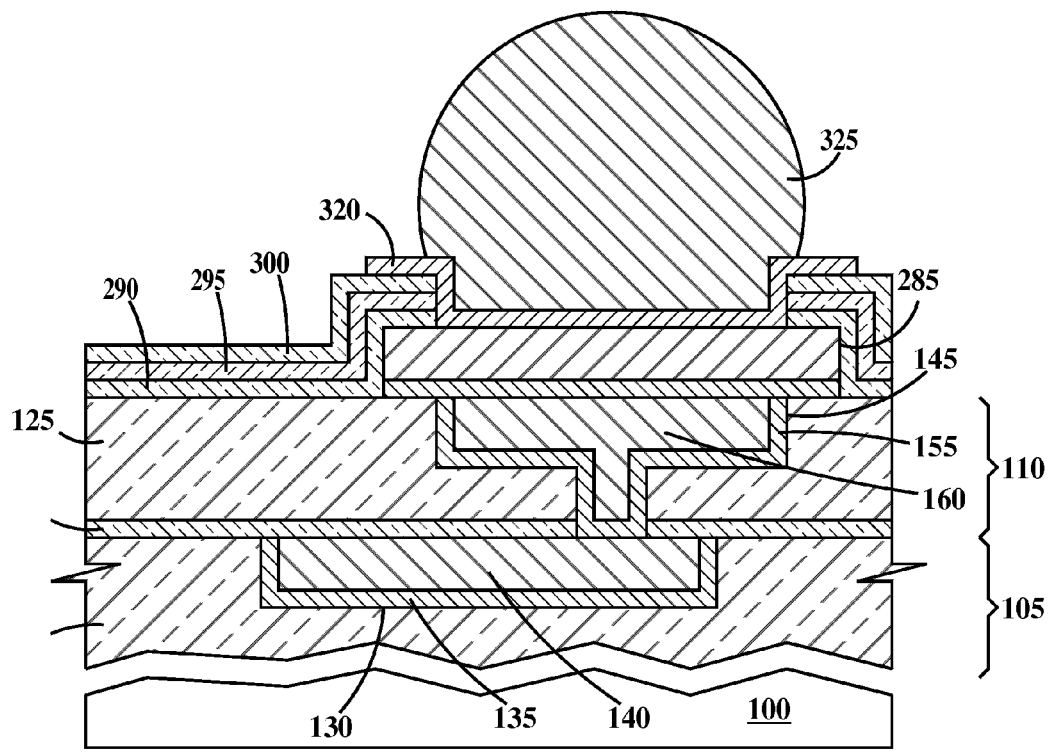

In FIG. 3F, further processing is performed in order to make a solder bump connection to terminal pad 285. In FIG. 3F a BLM pad 320 is formed on terminal pad 285. A solder bump 325 is then formed on BLM pad 320. Solder bump 325 is illustrated after a thermal reflow process has been performed. In one example, BLM pad 320 and solder bump 325 are formed by evaporation through a metal mask. In a second example, BLM pad 320 is formed by evaporation through a metal mask and solder bump 325 is formed by electroplating through an organic mask after the BLM is formed. In one example BLM pad 320 is formed from multiple layers of metals, each layer selected from the group consisting of Cr, Cu, Au, Ni, Ti, TiN, Ta and TaN. In one example, BLM pad 320 comprises a layer of Cu over a layer of Cr in contact with terminal pad 285 and a layer of Au over the layer of Cu. In one example, BLM pad 320 comprises a layer of Ni over a layer of Cr in contact with terminal pad 285 and a layer of Au over the layer of Ni. In one example, solder bump 325 comprises a Pb/Sn alloy.

Figure 4A:
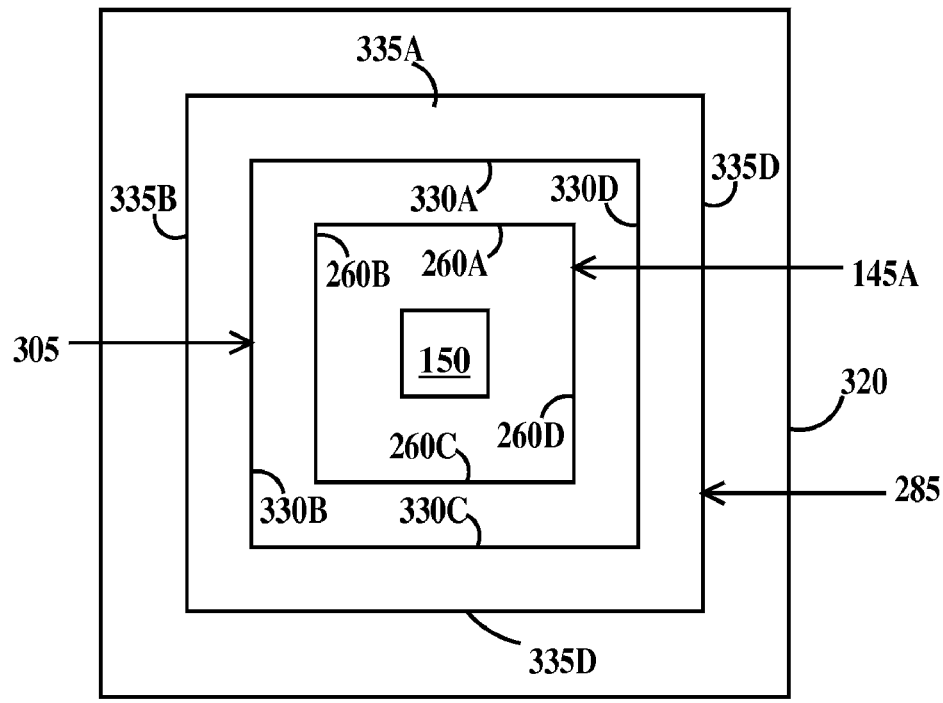
FIGS. 4A through 4B are top views of terminal pads according to the second embodiment of the present invention.
Figure 4B:
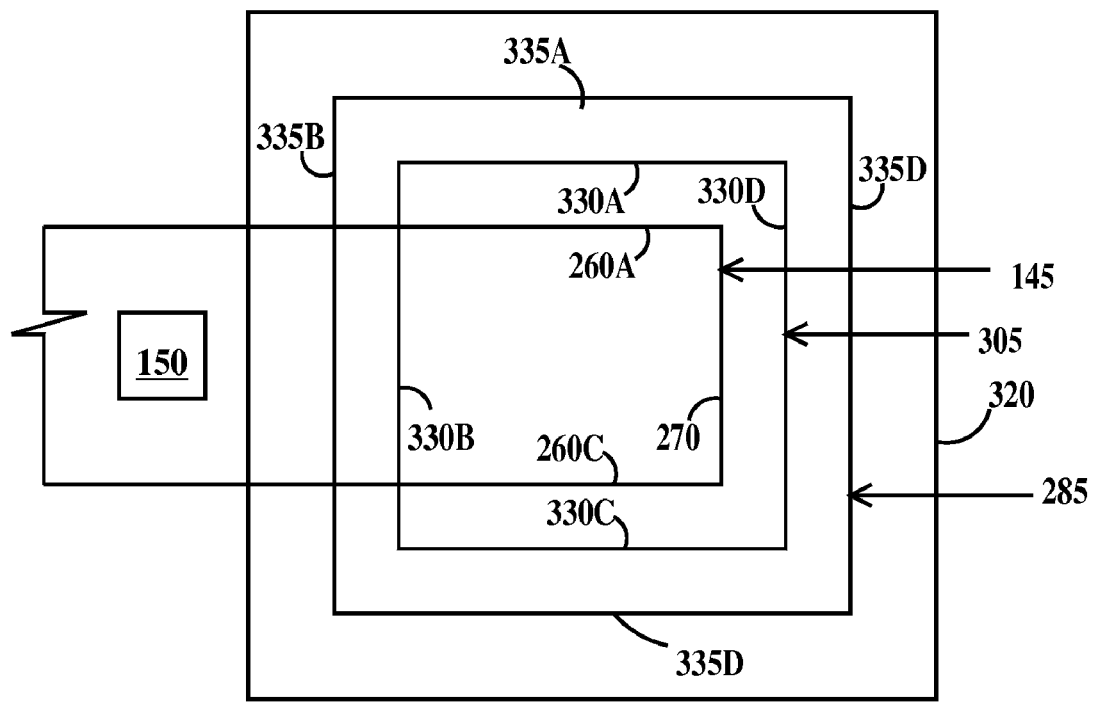

FIGS. 4A through 4B are top views of terminal pads according to the second embodiment of the present invention. FIGS. 4A and 4B are top views of terminal pads according the second embodiment of the present invention. In FIG. 4A, wire 145 (see FIG. 1E or 1F) is in itself a wiring pad 145A having sides 260A, 260B, 260C and 260D. Via 305 has sides 330A, 330B, 330C and 330D. Terminal pad 285 has sides 335A, 335B, 335C and 335D. Sides 260A, 260B, 260C and 260D of wire pad 145A are aligned within the perimeter formed by sides 330A, 330B, 330C and 330D of via 305. Sides 330A, 330B, 330C and 330D of via 305 are aligned within the perimeter formed by sides 335A, 335B, 335C and 335D of terminal pad 285. In FIG. 4A, BLM 320 overlaps sides 335A, 335B, 335C and 335D of via 305.

In FIG. 4B, wire 145 has sides 260A, 260C and an end 270. Terminal pad 285 has sides 335A, 335B, 335C and 335D. Sides 335A, 335B, 335C and 335D of terminal pas 285 are aligned within respective sides 260A, 260C and end 270 of wire 145. In FIG. 4B, BLM 320 overlaps sides 260A, 260C and end 270 of wire 145 as well as sides 330A, 330B, 330C and 330D of via 305 and sides 335A, 335B, 335C and 335D of terminal pad 285. Alternatively, BLM 320 may overlaps sides 330A, 330B, 330C and 330D of via 305 but not overlap sides 335A, 335B, 335C and 335D of terminal pad 285.

Thus the present invention provides cost performance terminal pad structures and fabrication processes having structural strength and contamination seal abilities.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    forming an electrically conductive wire in a dielectric layer on a substrate, said wire comprising an electrically conductive first core conductor and a conformal and electrically conductive first liner only on sidewalls and a bottom surface of said first core conductor;
    forming a passivation layer on said top surface of said dielectric layer and a top surface of said wire, said wire extending from said top surface of said dielectric layer to a bottom surface of said dielectric layer;
    forming a trench in said passivation layer, said trench extending from a top surface of said passivation layer to said top surface of said wire;
    forming a terminal pad comprising an electrically conductive second core conductor and an electrically conductive second liner on sidewalls and the bottom of said trench, said second core conductor filling all portions of said trench not filled by said second liner, a top surface of said terminal pad coplanar with a top surface of said passivation layer, a first perimeter defined by all sides of said terminal pad aligned entirely within a second perimeter defined by all sides of said wire;
    forming a ball-limiting-metallurgy pad on a top surface of said terminal pad and extending past all sides of said terminal pad; and
    forming a solder bump on a top surface of said ball-limiting-metallurgy pad.

2. The method of claim 1, wherein an entire top surface of said wire is coplanar with a top surface of said dielectric layer.

3. The method of claim 1, wherein said passivation layer comprises a lower dielectric layer on said top surfaces of said dielectric layer and said wire, an intermediate dielectric layer on a top surface of said lower dielectric layer and an upper dielectric layer on a top surface of said intermediate dielectric layer.

4. The method of claim 3, wherein:
    said lower dielectric layer comprises silicon nitride or silicon carbide nitride;
    said intermediate dielectric layer comprises silicon dioxide; and
    said upper dielectric layer comprises silicon nitride.

5. The method of claim 1, wherein said second liner is in direct physical and electrical contact with said top surface of said wire.

6. The method of claim 1, wherein only said first core conductor is exposed in a bottom of said trench.

7. The method of claim 1, wherein said passivation layer further includes a chemical-mechanical-polish etch stop layer formed on a top surface of said dielectric layer.

8. The method of claim 7, wherein said forming said terminal pad includes removing said chemical-mechanical-polish etch stop layer.

9. The method of claim 1, wherein forming said terminal pad includes:
    forming a conformal layer of second liner material on sidewalls and a bottom of said trench and on said top surface of said passivation layer;
    forming a layer of second core conductor material on a top surface of said second liner, said layer of second core conductor material completely filling remaining space in said trench; and
    performing a chemical-mechanical polish to remove any of said layer of said second core conductor material and said second conformal layer of said second liner material outside of said trench.

10. The method of claim 1, wherein said first perimeter defined by all sides of said terminal pad is aligned entirely within a third perimeter defined by all sides of said first core conductor.

11. The method of claim 1, wherein a third perimeter defined by all sides of said solder bump is aligned entirely within a fourth perimeter defined by all sides of said ball-limiting metallurgy pad.

12. The method of claim 1, wherein said first core conductor comprises copper.

13. The method of claim 1, wherein: said first and second liners independently comprises Ti, TiN, Ta, TaN, W or combinations thereof.

14. The method of claim 1, wherein said second core conductor comprises Al.

15. The method of claim 1, wherein said second core conductor consists of a single layer of AlCu.

16. The method of claim 15, wherein said second core conductor comprise AlCu and not more than about 1% Cu.

17. The method of claim 1, wherein said first core conductor comprises Cu and said second core conductor comprises Al or AlCu.

* * * * *